United States Patent
Davis et al.

(10) Patent No.: US 7,815,812 B2
(45) Date of Patent: Oct. 19, 2010

(54) METHOD FOR CONTROLLING A PROCESS FOR FABRICATING INTEGRATED DEVICES

(75) Inventors: Matthew F. Davis, Brookdale, CA (US); Lei Lian, Santa Clara, CA (US); Barbara Schmidt, Dresden (DE)

(73) Assignee: Applied Materials, Inc., Santa Clara, CA (US)

( * ) Notice: Subject to any disclaimer, the term of this patent is extended or adjusted under 35 U.S.C. 154(b) by 1056 days.

(21) Appl. No.: 11/536,204

(22) Filed: Sep. 28, 2006

(65) Prior Publication Data

US 2007/0017896 A1      Jan. 25, 2007

Related U.S. Application Data

(63) Continuation of application No. 10/805,136, filed on Mar. 19, 2004.

(60) Provisional application No. 60/462,493, filed on Apr. 11, 2003.

(51) Int. Cl.
B21J 19/04 (2006.01)

(52) U.S. Cl. .............. 216/59; 216/37; 216/67; 438/5; 438/14; 700/29; 700/212

(58) Field of Classification Search .............. 216/37, 216/59, 67; 438/5, 14; 700/29, 121
See application file for complete search history.

(56) References Cited

U.S. PATENT DOCUMENTS

| | | | |
|---|---|---|---|
| 4,767,496 A | 8/1988 | Hieber | |
| 5,403,435 A * | 4/1995 | Cathey et al. | 438/669 |
| 5,798,529 A | 8/1998 | Wagner | |
| 5,926,690 A | 7/1999 | Toprac et al. | |
| 5,948,203 A | 9/1999 | Wang | |
| 6,004,706 A | 12/1999 | Ausschnitt et al. | |
| 6,027,842 A | 2/2000 | Ausschnitt et al. | |
| 6,161,054 A | 12/2000 | Rosenthal et al. | |
| 6,245,581 B1 | 6/2001 | Bonser et al. | |
| 6,424,417 B1 | 7/2002 | Cohen et al. | |
| 6,486,492 B1 | 11/2002 | Su | |
| 6,566,025 B1 | 5/2003 | McStravick et al. | |
| 6,567,717 B2 * | 5/2003 | Krivokapic et al. | 700/121 |
| 6,625,497 B2 * | 9/2003 | Fairbairn et al. | 700/1 |

(Continued)

OTHER PUBLICATIONS

Lee, et al., "Analysis of Reflectometry and Ellipsometry Data from Patterned Structures." Characterization and Metrology for UCSI Technology: 1998 International Conference, Seiler, et al., eds., p. 331-335.

(Continued)

*Primary Examiner*—Lan Vinh
*Assistant Examiner*—Maki A Angadi
(74) *Attorney, Agent, or Firm*—Moser IP Law Group

(57) ABSTRACT

A method for controlling a process for fabricating integrated devices on a substrate. The method includes ex-situ and in-situ measurements of pre-etch and post-etch dimensions for structures formed on the substrate and uses the results of the measurements to adjust process recipes and to control the operational status of etch and external substrate processing equipment. In one exemplary application, the method is used during a multi-pass process for fabricating a capacitive structure of a trench capacitor.

19 Claims, 13 Drawing Sheets

U.S. PATENT DOCUMENTS

2002/0171828 A1  11/2002  Cohen et al.
2003/0022510 A1*  1/2003  Morgenstern ............... 438/707
2004/0078108 A1*  4/2004  Choo et al. ................. 700/121
2004/0087041 A1*  5/2004  Perry et al. .................... 438/5

OTHER PUBLICATIONS

Raymond, "Angle-resolved scatterometry for semiconductor manufacturing," Microlithography World, Winter 2000.

Toprac, A. "AMD's Advanced Process Control of Ply-Gate Critical Dimension," Proc. SPIE vol. 3882. p. 62-65, Sep. 1999.

Yang, et al., "Line-profile and Critical Dimension Measurements Using a Normal Incidence Optical Metrology System," Proceedings of SPIE vol. 4689, Mar. 2002.

* cited by examiner

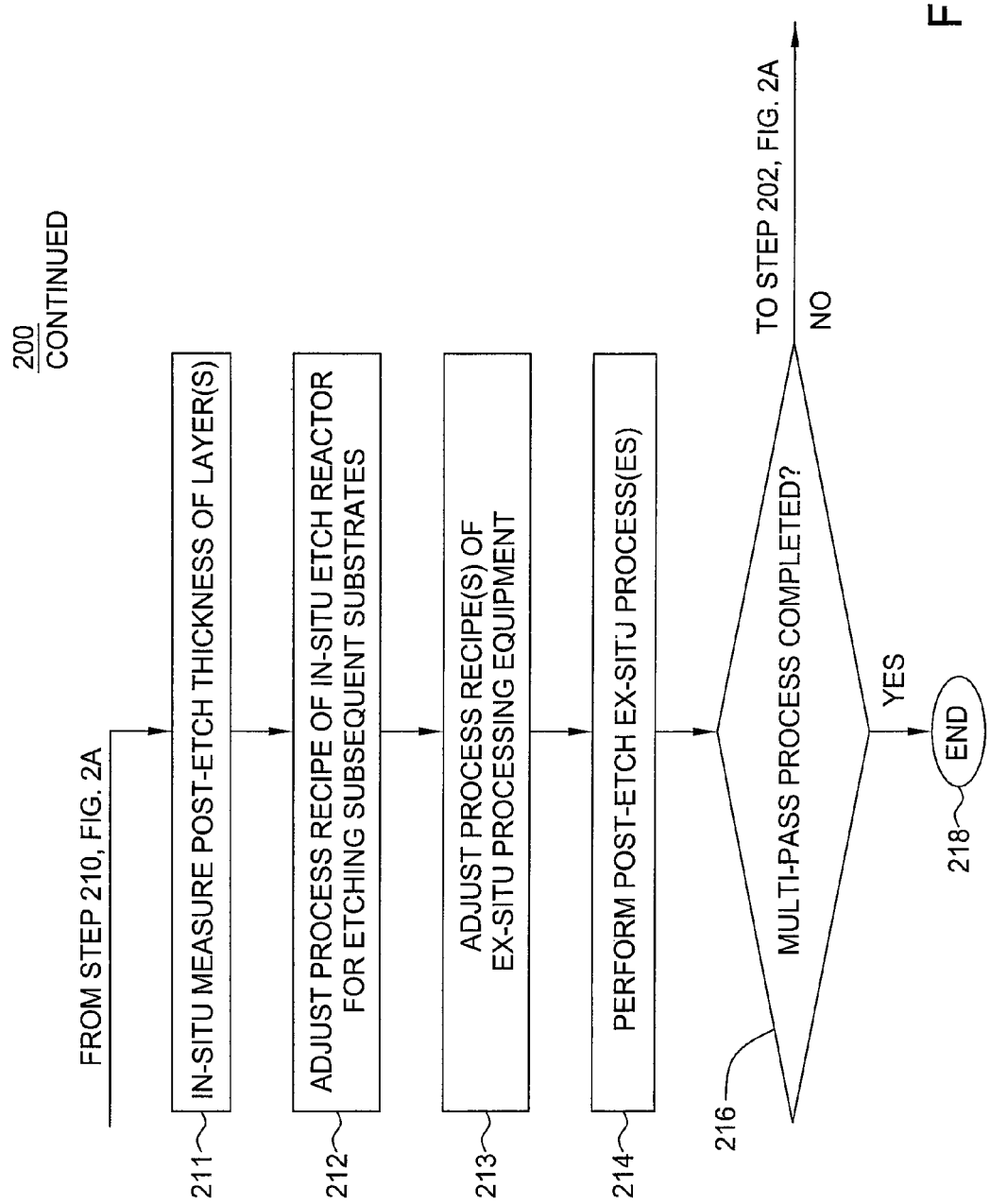

METHOD FOR CONTROLLING A PROCESS FOR FABRICATING INTEGRATED DEVICES

CROSS-REFERENCE TO RELATED APPLICATIONS

This application is a continuation of co-pending U.S. patent application Ser. No. 10/805,136, filed Mar. 19, 2004, which claims benefit of U.S. provisional patent application Ser. No. 60/462,493, filed Apr. 11, 2003. Each of the aforementioned related patent applications is herein incorporated by reference.

BACKGROUND OF THE INVENTION

1. Field of the Invention

The present invention generally relates to semiconductor substrate processing. More specifically, the present invention relates to controlling processes in the manufacture of integrated circuits.

2. Description of the Related Art

Integrated circuits may include more than one million micro-electronic devices (e.g., capacitors, transistors, and the like) that are formed on a substrate (e.g., silicon (Si) wafer) and cooperate to perform various functions within the circuit. Fabrication of the micro-electronic devices may comprise multi-pass processes in which one or more layers of a film stack of the device are repeatedly deposited and selectively etched, thereby forming structures of the devices being fabricated.

To control the multi-pass process, dimensions (i.e. critical dimensions) of the respective elements of the structures are generally measured on a batch of the substrates processed using specific processing equipment (e.g., deposition, etch, or chemical mechanical polishing (CMP) processing equipment, and the like). The results of the measurements are then statistically averaged for that batch of the substrates and used to adjust the processing equipment. Such measurements are typically performed using measuring tools, which are external (i.e., ex-situ measuring tools) to the processing equipment.

This method does not allow compensating for substrate-to-substrate variations of the critical dimensions within the batch of the substrates. Manufacturing variables of different processes comprising a pass of the multi-pass process may combine and broaden distribution of the critical dimensions of the elements of the structures beyond allowable ranges. As such, some structures and devices may be defective.

Therefore, there is a need in the art for an improved method for controlling a multi-pass process of fabricating integrated devices.

SUMMARY OF THE INVENTION

The present invention is a method for controlling a process for fabricating integrated devices on a substrate. The method includes obtaining ex-situ and in-situ measurements of pre-etch and post-etch dimensions for structures formed on the substrate and uses the results of the measurements to adjust process recipes and to control the operational status of etch and external substrate processing equipment. In one embodiment, the ex-situ measurement may be obtained using a measurement tool or device disposed within a processing platform (i.e., cluster tool) wherein the substrate is processed. Alternatively, the ex-situ measurement may be obtained using a measurement tool or device disposed remotely to the processing platform in which the substrate is processed. In one exemplary application, the method is used during a multi-pass process for fabricating a capacitive structure of a trench capacitor.

BRIEF DESCRIPTION OF THE DRAWINGS

The teachings of the present invention can be readily understood by considering the following detailed description in conjunction with the accompanying drawings, in which:

FIGS. 2A-2B depict a flow diagram of a method for controlling the multi-pass process of FIG. 1 in accordance with one embodiment of the present invention;

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method for controlling a process for fabricating integrated circuit devices on substrates (e.g., semiconductor substrates, such as silicon (Si) wafers, and the like). The method uses the results of pre-etch and post-etch measurements for structures being formed on the substrate to adjust process recipes and control operational status of substrate processing equipment. The measurements are performed using, with respect to an etch reactor, in-situ and ex-situ measuring tools. The invention is generally used during fabrication of ultra-large-scale integrated (ULSI) semiconductor devices and circuits. In one exemplary application, the method is used during fabrication of a trench capacitor of a memory or logic integrated device.

Figure 1:
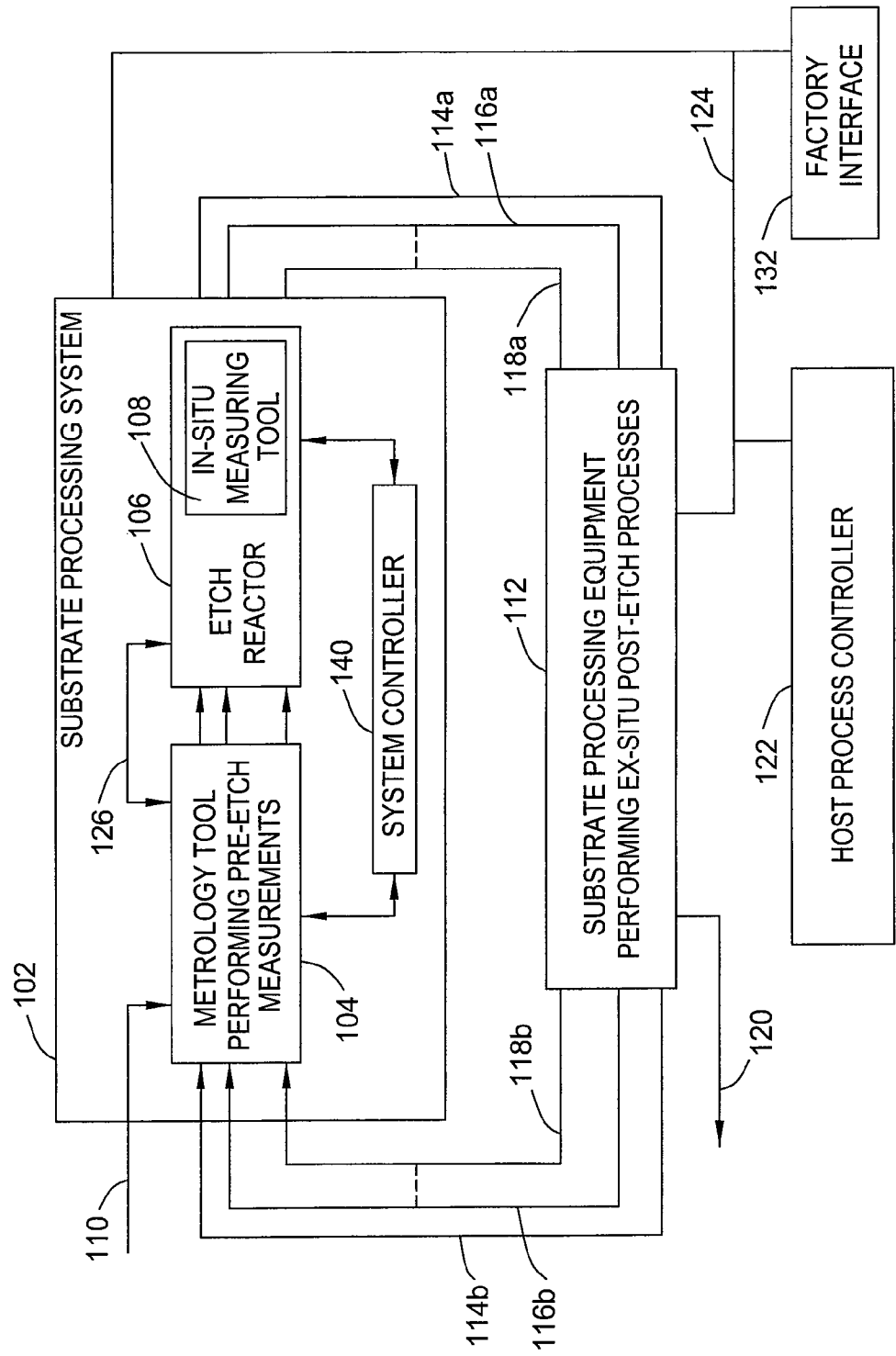
FIG. 1 depicts an exemplary schematic diagram of a multi-pass process for fabricating integrated circuit devices in accordance with one embodiment of the present invention.

FIG. 1 depicts an exemplary schematic diagram of a multi-pass process 100 for fabricating integrated devices. The multi-pass process 100 generally comprises a plurality of passes (three passes are shown) where, during a pass, a substrate undergoes an etch process and at least one post-etch etch process (e.g., chemical mechanical polishing process, a deposition process, an etch process, a lithographic process, and the like).

The multi-pass process 100 starts when the substrate is delivered (shown with a link 110) to a measuring tool 104. The substrate may be transferred to the measuring tool 104 using, for example, a factory interface 132, as shown using a link 110a. The measuring tool 104 is disposed external to (i.e., outside) an etch reactor 106 and is considered, with respect to the reactor 106, to be an ex-situ measuring tool. The measuring tool 104 is configured to perform pre-etch measurements of dimensions (i.e., critical dimensions) and thickness of layers, film stacks, and structures on the substrate. After the pre-etch measurements, the substrate is transferred to the etch reactor 106. The etch reactor 106 comprises a measuring tool 108 (i.e., in-situ measuring tool) that may be configured to perform pre-etch and/or post-etch in-situ measurements of the thickness of layers, film stacks, and structures on the substrate. In one exemplary embodiment, the ex-situ measuring tool 104 and etch reactor 106 are modules of a substrate processing system 102 (i.e., cluster tool). After the etch process, the substrate may optionally be returned to the measuring tool 104 (illustrated using a link 126) for performing additional selective measurements on the substrate.

In one alternate embodiment, during at least one pass of the multi-pass process 100, the substrate may be delivered to the etch reactor 106. As such, the pre-etch measurements using the ex-situ measuring tool are optional.

In another alternate embodiment, during at least one pass of the multi-pass process 100, after the etch process the substrate may be transferred to the post-etch processing equipment 112. As such, the post-etch measurements using the ex-situ measuring tool are optional.

From the substrate processing system 102, the substrate is transferred to post-etch processing equipment 112 that is, with respect to the system 102, an external (i.e., ex-situ) processing equipment. The substrate may be transferred to the processing equipment 112 using, for example, the factory interface 132, as shown using a link 114a. The ex-situ processing equipment 112 performs post-etch processes. The post-etch processes may comprise at least one process, such as a chemical mechanical polishing (CMP), process a deposition process, an etch process, an oxidation process, an annealing process, a lithographic process, and the like. When the ex-situ post-etch processes are completed, the substrate is transferred back to the measuring tool 104 (shown using a link 114b).

During subsequent passes (shown with links 116a-116b and 118a-118b) of the multi-pass process 100, the substrate repeatedly travels through the measuring tool 104, etch reactor 106, and ex-situ processing equipment 112. Generally, the substrate may be transferred between the processing system 102 and ex-situ processing equipment 112 using the factory interface 132. Upon completion of the multi-pass process 100 (e.g., after a last ex-situ post-etch process of the final pass), the substrate may be transferred to a different processing zone (shown with a link 120) of the semiconductor fab.

Operation of the measuring tool 104 and etch reactor 106 is controlled using a system controller 140 of the substrate processing system 102. Accordingly, operation of the ex-situ processing equipment 112 may be controlled using system controllers of the respective units of such equipment, while execution of the multi-pass process 100 is generally administered using a host process controller 122 of a processing zone of the semiconductor fab. The host process controller 122 facilitates coordination of and exchange information between the substrate processing system 102, ex-situ processing equipment 112, and factory interface 132 using a bi-directional bus 124 (discussed in reference to FIG. 8 below).

In another embodiment, the measuring tool 104 providing pre-etch measurements may be disposed remote from the processing system 102. For example, the measuring tool 104 may be disposed in another location of a FAB housing the processing system 102. Information obtained by the measuring tool 104 remotely located within the FAB may be provided to the host process controller 122 thereby facilitating passing of pre-etch measurements to the system controller 140 and the etch reactor 106.

In one exemplary embodiment, the substrate processing system 102 is the TRANSFORMA™ integrated semiconductor wafer processing system available from Applied Materials, Inc. of Santa Clara, Calif. In this embodiment, the ex-situ measuring tool 104 is an optical measuring tool such as is available from Nanometrics Incorporated, located in Milpitas, Calif. The etch reactor 106 and the in-situ measuring tool 108 are, respectively, the DPS II plasma etch module, and the EYED™ module (both available from Applied Materials, Inc.).

Suitable ex-situ measuring tools are disclosed in commonly assigned U.S. Pat. No. 6,486,492 B1, issued Nov. 26, 2002 and U.S. Pat. No. 6,150,664, issued Nov. 21, 2000, which are incorporated herein by reference. The measuring tool 104 may be configured to perform a broad range of non-destructive measurements using a variety of optical measuring techniques (e.g., spectroscopy, interferometry, scatterometry, reflectometry, ellipsometry, and the like).

Suitable in-situ measuring tools are disclosed in commonly assigned U.S. Pat. No. 6,455,437, issued Sep. 24, 2002, U.S. Pat. No. 6,368,975, issued Jul. 2, 2002, and U.S. Pat. No. 6,413,867, issued Apr. 9, 2002, all of which are incorporated herein by reference in there entireties. Salient features of the in-situ measuring tool are briefly discussed below in reference to FIG. 6.

Figure 2A:
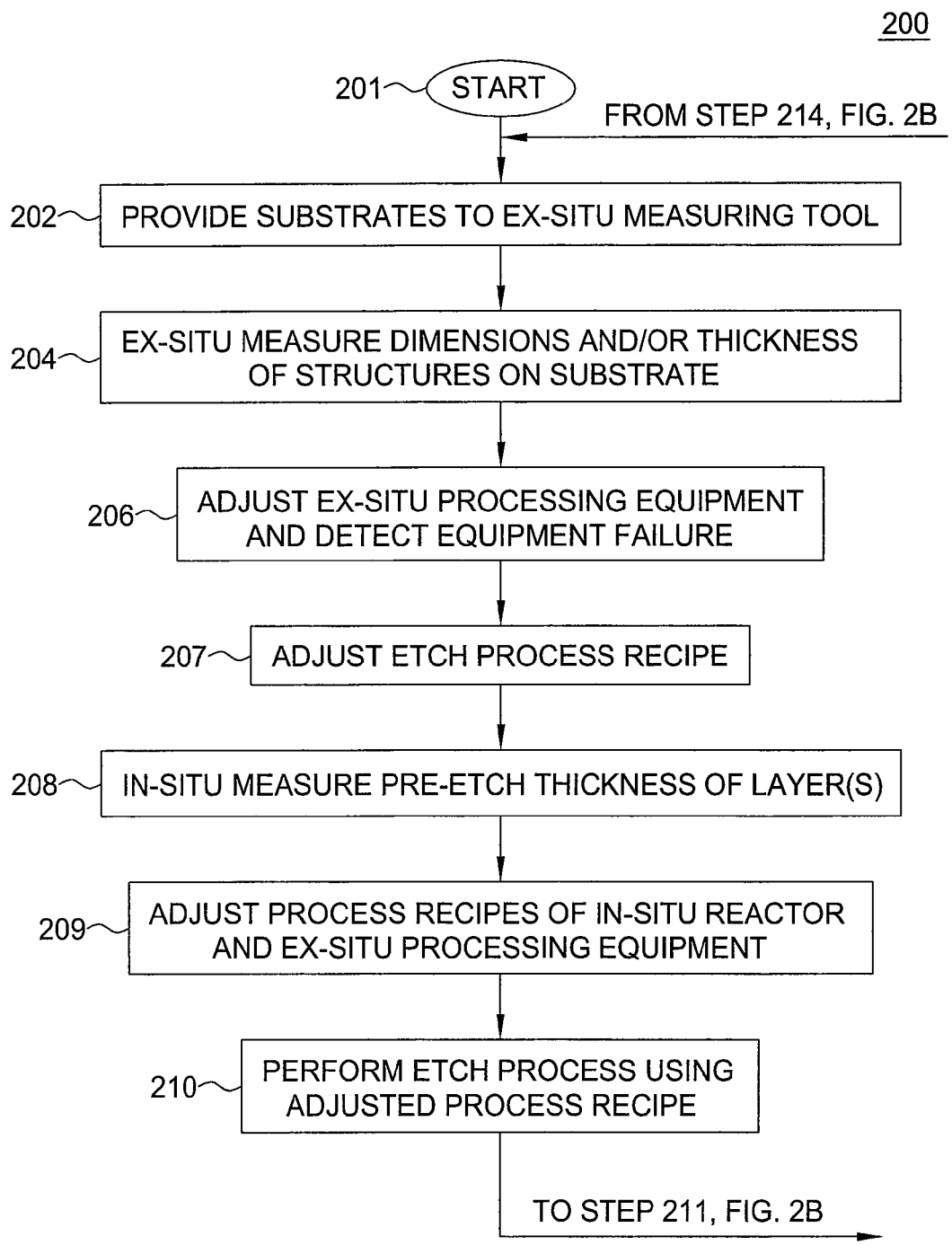

FIGS. 2A-2B depict a flow diagram of one embodiment of the inventive method for controlling the multi-pass process 100 of fabricating integrated devices as sequence 200. The sequence 200 includes the processes that are performed upon a substrate during the multi-pass process.

The sequence 200 starts at step 201 and proceeds to step 202. At step 202, a substrate is provided using, e.g., the factory interface 132, to the ex-situ measuring tool 104 of the substrate processing system 102.

At step 204, the measuring tool 104 obtains ex-situ pre-etch measurements of the dimensions (e.g., critical dimensions) and/or thickness of layers, film stacks, and structures on the substrate. The measurements are typically obtained in a statistically significant number of regions (e.g., 5 to 9 or more regions) of the substrate, and then processed (i.e., averaged) for that substrate. The results of the measurements are generally provided to the system controller 140 and host process controller 122.

At step 206, the results of the ex-situ pre-etch measurements of step 202 are used to adjust process recipe(s) of the ex-situ processing equipment (e.g., processing equipment 112) that was used to fabricate the measured layers, films stacks and structures. When at least one measured parameter (e.g., critical dimensions, height of a film stack, thickness of a material layer, and the like) is outside of the allowable range, step 204 detects a failure of the ex-situ processing equipment and notifies the operators. Generally the ex-situ processing equipment is adjusted or equipment failure is detected using the host process controller 122 or, alternatively, a remote processor.

At step 207, the results of the ex-situ pre-etch measurements of step 204 may be used to adjust a process recipe of the subsequent etch process (discussed in reference to step 210 below) to be performed upon the substrate. Generally, step 207 calculates an adjustment for the process recipe that is typically used during such etch process.

At step 208, the substrate is transferred to the etch reactor 106 where the in-situ measuring tool 108 selectively measures pre-etch thickness of layers on the substrate. The results of these measurements are generally provided to the system controller 140 and host process controller 122.

At step 209, the results of the in-situ pre-etch measurements may be used to validate the measurements performed during step 204 and adjust the process recipe of the etch process to be performed in the etch reactor 106 (discussed in reference to step 210 below). Additionally, the results of the in-situ pre-etch measurements may be used to adjust the ex-situ processing equipment performing the pre-etch processing of the substrate or detect a failure of that equipment, as discussed in step 206 above in reference to the pre-etch measurements performed using the ex-situ measuring tool 104.

At step 210, the etch reactor 106 performs the etch process using the process recipe adjusted, at step 207, using the results of the ex-situ measurements obtained by the ex-situ measuring tool and, at step 209, using the results of the in-situ measurements obtained by the in-situ measuring tool, respectively. Examples of parameters that may be adjusted to control the etch process include, but are not limited to, plasma power, bias power, substrate temperature, chamber pressure, gas composition and end point detection, among others.

At step 211, the in-situ measuring tool 108 obtained post-etch measurements of thickness of the structures formed using the etch process of step 210. The results of these measurements are generally provided to the system controller 140 and host process controller 122.

At step 212, the results of the in-situ post-etch measurements of step 211 may be used to adjust the process recipe of the etch process of step 210 performed on subsequent substrates of the same batch of the substrates. The etch process recipe may be adjusted using the system controller 140, host process controller 122, or, alternatively, a remote processor.

At step 213, the results of the in-situ post-etch measurements may be used to adjust process recipe(s) of the ex-situ processing equipment 112 performing the post-etch processing upon the substrate. The process recipe(s) may be adjusted using respective controller(s) of the ex-situ processing equipment 112, the host process controller 122, or, alternatively, a remote processor.

At step 214, the substrate is transferred from the substrate processing system 102 to the ex-situ processing equipment 112 to perform at least one post-etch process (e.g., a deposition process, chemical mechanical polishing process, an etch process, an oxidation process, an annealing process, and the like) upon the substrate. The processing equipment 112 uses the process recipes adjusted during step 212.

At step 216, the sequence 200 queries if all passes of the multi-pass process 100 being performed are competed. If the query of step 216 is negatively answered, the sequence 200 proceeds to step 202. If the query of step 216 is affirmatively answered, the sequence 200 proceeds to step 218. At step 218, the sequence 200 ends.

Figure 2C:
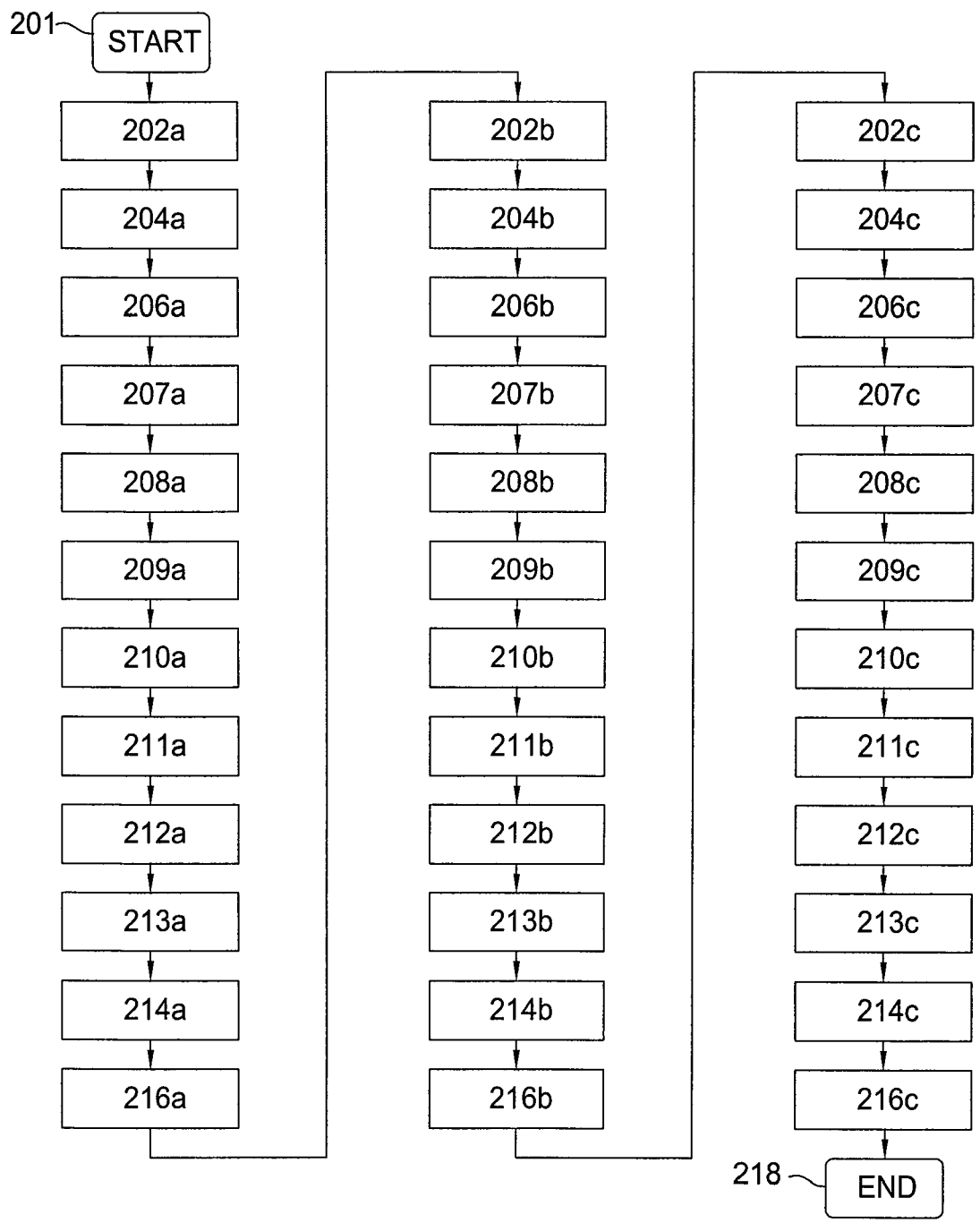
FIG. 2C depicts a flow diagram of FIGS. 2A-2B when the present invention is illustratively used for controlling an exemplary multi-step process for fabricating a capacitive structure of a trench capacitor.

FIG. 2C depicts a flow diagram of FIGS. 2A-2B when the present invention is illustratively used for controlling an exemplary multi-step process of fabricating a capacitive structure of a trench capacitor (e.g., a memory or logic integrated device) as sequence 200a-c.

In one exemplary embodiment, the multi-pass process of fabricating the capacitive structure comprises three passes. These passes comprise processing steps (denoted herein using suffixes "a", "b", and "c"), which are identified using the same reference numerals as the respective processing steps of the sequence 200, except that the suffixes "a", "b", and "c" have been added to differentiate between the passes. In this embodiment, the ex-situ and in-situ measurements and in-situ etch processes of the multi-pass process are performed using the metrology and etch modules of the CENTURA® processing system.

FIGS. 3A-3F depict a series of schematic, cross-sectional views of a substrate having a capacitive structure of a trench capacitor. The capacitive structure is fabricated applying a multi-pass process that is controlled using the inventive method. The cross-sectional views in FIGS. 3A-3F are not depicted to scale and are simplified for illustrative purposes. To best understand the invention, the reader should simultaneously refer to FIG. 2C and FIGS. 3A-3F.

Figure 3A:
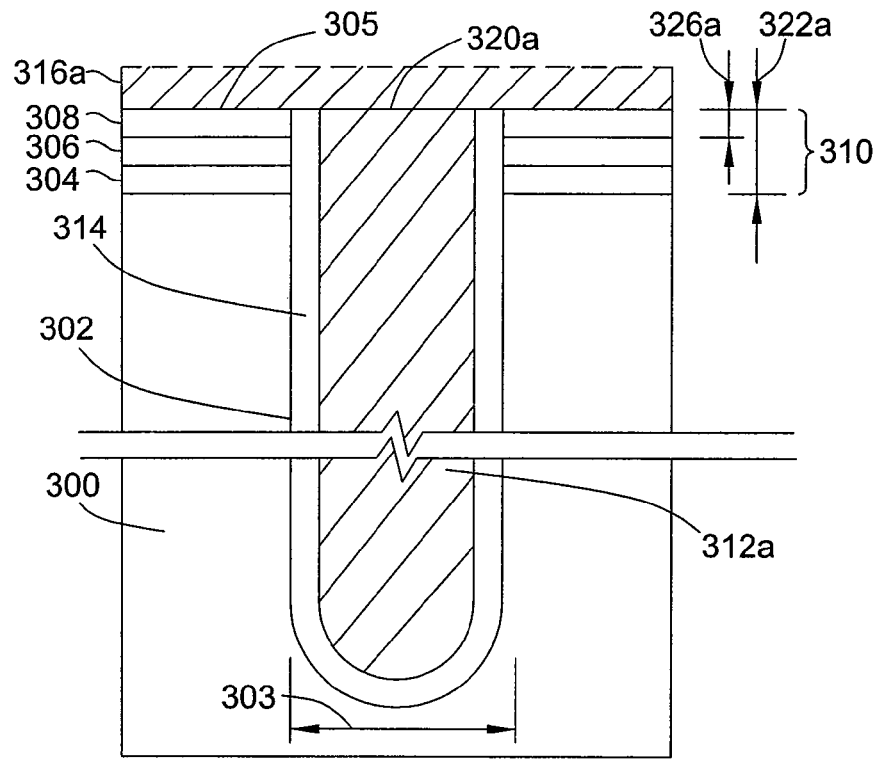
FIGS. 3A-3F depict a series of schematic, cross-sectional views of a substrate having a capacitive structure of a trench capacitor being formed in accordance with the method of FIG. 2C.

In one exemplary embodiment, the capacitive structure of the trench capacitor is illustratively fabricated on a substrate 300 (e.g., silicon wafer, and the like). The substrate 300 generally comprises a trench 302 having a conformal insulating layer 314, a film stack 310, and an electrode layer 312a (FIG. 3A).

The trench 302 typically has a width 303 (shown in FIG. 3A only) of about 110 nm and an aspect ratio (i.e., ratio of a depth to the width) about 3 to 1. In one embodiment, the layer 314 is formed of silicon dioxide ($SiO_2$). In alternate embodiment, the layer 314 may be formed of a dielectric material having a dielectric constant greater than 4.0 (i.e., high-k material), e.g., hafnium dioxide ($HfO_2$), aluminum oxide ($Al_2O_3$), and the like. Such high-k layer 314 typically also comprises a thin sub-layer (not shown) of silicon dioxide that is inherently formed when excess oxygen from the high-k material contacts the silicon of the substrate 300. The film stack 310 comprises a silicon dioxide layer 304, a silicon nitride ($Si_3N_4$) layer 306, and an optional hard mask layer 308 (e.g., silicon oxynitride (SiON), and the like). Generally, the film stack 310 has a thickness 322a of about 140 nm. The film stack 310 may also comprise layers formed of other materials or layers having different thickness.

The layers the film stack 310 and layer 314 may be formed using any conventional deposition technique, such as atomic layer deposition (ALD), physical vapor deposition (PVD), chemical vapor deposition (CVD), plasma enhanced CVD (PECVD), and the like. Fabrication of the trench capacitor may be performed using the respective processing modules of CENTURA®, ENDURA®, and other processing systems available from Applied Materials, Inc. of Santa Clara, Calif.

The electrode layer 312a is generally formed from doped polysilicon using a PVD or CVD process that contemporaneously fills the trench 302 (layer 312a) and deposits a layer 316a (shown with broken line) of excess polysilicon upon the film stack 310 and elsewhere on the substrate 300. Generally, the layer 316a has a thickness of about 2000 to 3000 Angstroms. After the polysilicon deposition process, the layer 316a is removed from the film stack 310. In one embodiment, the layer 316a is removed using a CMP process that polished the polysilicon away to a level 320a coplanar with an upper surface 305 of the mask layer 308.

The CMP process may over-polish or under-polish the layer 316a. When the layer 316a is under-polished (i.e., partially removed from the film stack 310), the remaining portion of the layer 316a may decrease dimensional accuracy of subsequent polysilicon etch back process (discussed in reference to step 208a below) having the process time calculated using the surface 305 as a reference. Accordingly, overetching the layer 316a causes damage to the layer(s) of the film stack 310, as well as may similarly decrease dimensional accuracy of the etch back process.

The sequence 200a-c starts at step 201 and proceeds to step 202a. At step 202a, the substrate 300 is provided to the ex-situ measuring tool 104 of the processing system 102.

At step 204a, the ex-situ measuring tool 104 obtains measurements (i.e., ex-situ pre-etch measurements) of the thickness 322a of the film stack 310 and/or measurements of a thickness 326a of the mask layer 308. The measurements are typically obtained in a statistically significant number of regions (e.g., 5 to 9 or more regions) of the substrate 300, and then mathematically processed (i.e., averaged) for the substrate. The results of the measurements are generally provided to a controller of the processing system 102 and the host process controller 122.

At step 206a, the results of the ex-situ pre-etch measurements of step 204a are used to adjust the CMP processing equipment used to remove (i.e., polish away) the layer 316a. When the thickness 322a of the film stack 310 or the thickness 326a of the mask layer 308 are outside of the respective allowable ranges, step 206a detects a failure of the CMP processing equipment and notifies the operators. Additionally, step 206a may adjust the polysilicon deposition equipment (e.g., PVD or CVD equipment) to increase the thickness 326a of the mask layer 308. Generally, the CMP processing equipment may be adjusted or equipment failure is detected using the host controller 122, controller of the system 102, controller of the CMP processing equipment, or, alternatively, a remote processor.

At step 207a, the results of the ex-situ pre-etch measurements of step 204a may be used to adjust a process recipe of subsequent etch process (discussed in reference to step 210a below) to be performed upon the substrate 300. Generally, step 207a calculates an adjustment for the process recipe that is typically used during such etch process.

At step 208a, the substrate 300 is transferred to an in-situ etch reactor of the processing system having the in-situ module 108. In one exemplary embodiment, the EYED™ module performs in-situ pre-etch measurements of the thickness 326a of the mask layer 308. The results of the measurements are generally provided to the controllers of the in-situ etch reactor and processing system 102 and the host controller 122.

In one embodiment, such in-situ etch reactor is the Decoupled Plasma Source (DPS) II module of the processing system 102. The DPS II module (discussed in reference to FIG. 6 below) uses an inductive source (i.e., antenna) to produce a high-density plasma and may control a substrate temperature in a range from about 20 to 350 degrees Celsius. To determine the endpoint of an etch process, the DPS II module may use an endpoint detection system to monitor plasma emissions at a particular wavelength, control of process time, laser interferometry, and the like.

At step 209a, the results of the in-situ pre-etch measurements of the thickness 326a may be used to selectively adjust the etch back process recipe (e.g., adjust etch selectivity for the silicon oxynitride material of the mask layer 308) that is used to etch back polysilicon layer 312a of the substrate 300 (discussed in reference to step 207a above). Additionally, the results of these measurements may be used to validate the ex-situ measurements of step 204a, as well as adjust the CMP processing equipment removing the layer 316a or detect a failure of the CMP equipment, as discussed in step 206a above in reference to the ex-situ pre-etch measurements obtained using the ex-situ measuring tool 104.

Figure 3B:
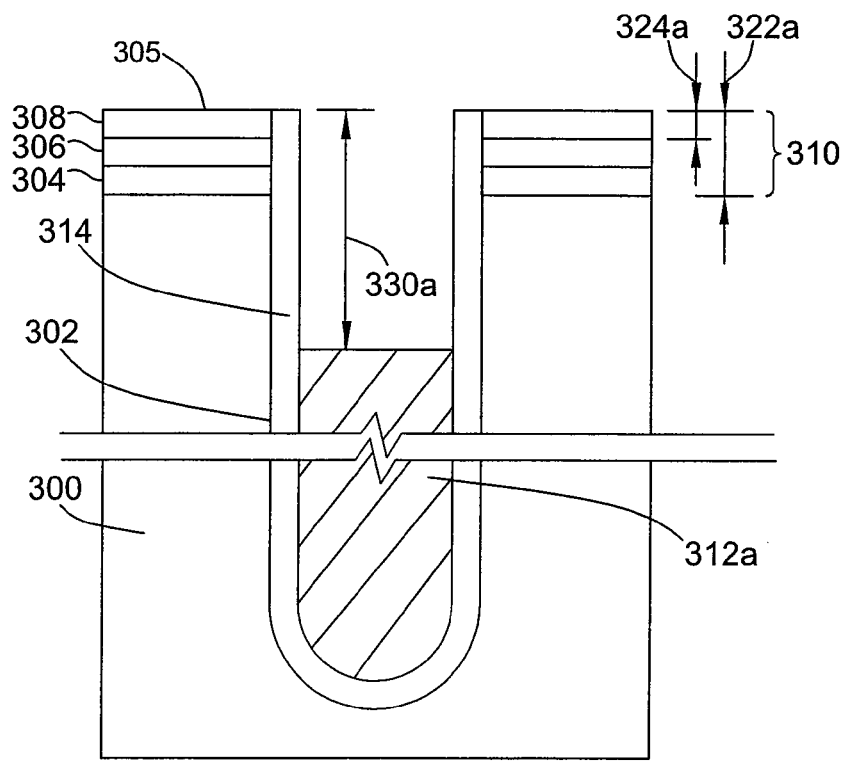

At step 210a, the DPS II module performs the polysilicon etch back process (FIG. 3B). Step 210a uses the process recipe adjusted, at step 207a, using the results of the ex-situ measurements obtained by the ex-situ measuring tool 104 and, at step 209a, using the results of the in-situ measurements obtained by the in-situ module 108, respectively. Specifically, step 208 etches the polysilicon layer 312a in the trench 302 to a pre-determined depth 330a.

In one illustrative embodiment, the layer 312a comprising doped polysilicon is etched using the DPS II module by providing hydrogen bromide (HBr) at a rate of 20 to 300 sccm, chlorine ($Cl_2$) at a rate of 20 to 300 sccm (i.e., a HBr:$Cl_2$ flow ratio ranging from 1:15 to 15:1), nitrogen ($N_2$) at a rate of 0 to 200 sccm, applying power to an inductively coupled antenna between 200 and 3000 W, applying a cathode bias power between 0 and 300 W, and maintaining a wafer temperature between 0 and 200 degrees Celsius at a pressure in the process chamber between 2 and 100 mTorr. One illustrative process HBr at a rate of 40 sccm, $Cl_2$ at a rate of 40 sccm (i.e., a HBr:$Cl_2$ flow ratio of about 1:1), $N_2$ at a rate of 20 sccm, applies 1100 W of power to the antenna, 20 W of a bias power, maintains a wafer temperature of 45 degrees Celsius, and a pressure of 4 mTorr. Such etch process provides etch selectivity for polysilicon (layer 312a) over silicon oxynitride (layer 308) of at least 20:1, as well as etch selectivity for polysilicon over silicon dioxide (layer 314) of about 20:1.

At step 211a, the in-situ module 103 generally performs in-situ post-etch measurements of the depth 330a and, optionally, a thickness 324a (i.e., post-etch thickness) of the mask layer 308. The results of these measurements are generally provided to the controller of the processing system 102 and the host controller 122.

At step 212a, the results of the in-situ post-etch measurements of step 211a may be used to adjust the process recipe of the polysilicon etch back process (e.g., polysilicon etch rate, process time, etch selectivity for the silicon oxynitride material of the mask layer 308, and the like) of step 210a performed on other substrates of the same batch of the substrates 300 (discussed in reference to step 207a above). The etch back process recipe may be adjusted using controllers of the DPS II module or processing system 102, the host process controller 122, or, alternatively, a remote processor.

At step 213a, the results of the in-situ post-etch measurements of step 211a may be used to adjust process recipes of the ex-situ processing equipment 112 performing post-etch processing (discussed in reference to step 214a below) upon the substrate 300. These process recipes may be adjusted using respective controller(s) of the ex-situ processing equipment 112, the host process controller 122, or, alternatively, a remote processor.

Figure 3C:
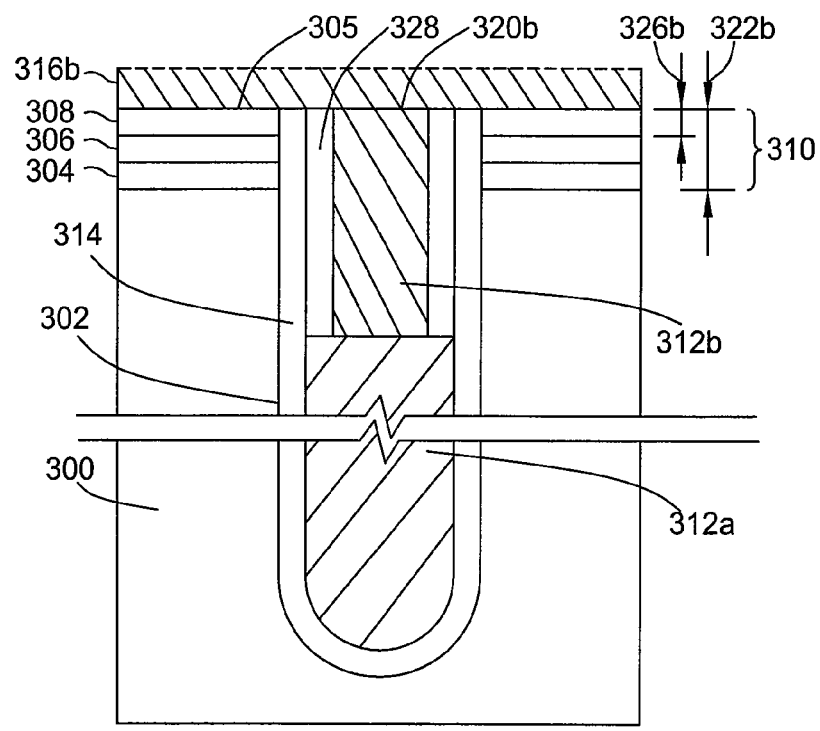

At step 214a, the post-etch ex-situ processes are performed upon the substrate 300 (FIG. 3C). In one exemplary embodiment, the ex-situ processing equipment (e.g., CVD, PVD, etch, CMP, and the like equipment) forms the collar layer 328 (e.g., TEOS oxide layer), fills the trench 302 with polysilicon (layer 312b), deposits a layer 316b of excess polysilicon on the film stack 310 and elsewhere on the substrate 300, and removes the layer 316b using the CMP process, as discussed above in reference to the layer 316a. Process recipes of the ex-situ post-etch processes (e.g., CMP process) may be adjusted using the results of the post-etch measurements performed at step 211a using the in-situ module 108.

At step 216a, the sequence 200a-c transfers the substrate 300 to the processing system 102 and proceeds to step 202b to perform processes of a second pass of the multi-pass process of fabricating the capacitive structure of the trench capacitor.

At step 202b, the substrate 300 is provided to the ex-situ measuring tool 104 of the processing system 102. In one embodiment, the substrate 300 is transferred to the processing system 102 that was used during the first pass of the multi-pass process, however, in an alternate embodiment, the substrate 300 may be transferred to a different processing system 102.

At step 204b, the ex-situ measuring tool 104 obtains the measurements of a thickness 322b of the film stack 310 and thickness 326b of the mask layer 308 as described above in step 204a in reference to the measurements of the thickness 322a and thickness 326a, respectively.

At step 206b, the results of the measurements of step 204b are used to adjust the CMP and/or polysilicon deposition processing equipment used at step 214a and detect a failure of such processing equipment, as described above in step 206a in reference to the measurements of step 204a.

At step 207b, the results of the measurements of step 204b may be used to adjust a process recipe of the subsequent etch process (discussed in reference to step 210b below), as described above in step 207a in reference to the results of the measurements of step 204a.

At step 208b, the substrate 300 is transferred to the DPS II module comprising the in-situ module 108. In one embodiment, the substrate 300 is transferred to the same DPS II module that performed the etch back process of step 210a. In an alternate embodiment, the substrate 300 may be transferred to a different DPS II module. In one exemplary embodiment, the in-situ module 108 obtains in-situ pre-etch measurements of the thickness 326b of the mask layer 308. The results of the measurements are generally provided to the controllers of the in-situ etch reactor and processing system 102 and the host process controller 122.

At step 209b, the results of the in-situ pre-etch measurements of the thickness 326b of the mask layer 308 are used to adjust the process recipe of the polysilicon etch back process, validate measurements of step 204b, and adjust the ex-situ processing equipment 112, as described above in step 209a in reference to the results of the measurements of the thickness 326a.

Figure 3D:
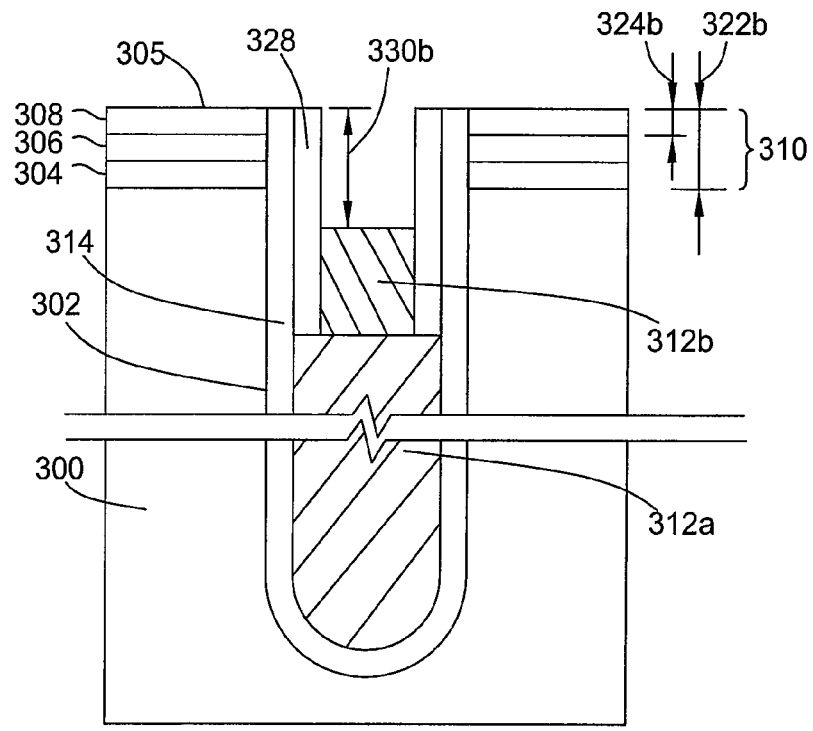

At step 210b, the DPS II module performs the polysilicon etch back process that etches the polysilicon layer 312b in the trench 302 to a pre-determined depth 330b (FIG. 3D). Step 210b uses the process recipe adjusted, at step 207b, using the results of the ex-situ measurements obtained by the ex-situ measuring tool 104 and, at step 209b, using the results of the in-situ measurements obtains by the in-situ module 108, respectively. Generally, steps 210a and 210b use the same or similar etchant gas mixtures.

At step 211b, the in-situ module 108 generally obtains in-situ post-etch measurements of the depth 330b and, optionally, a thickness 324b (i.e., post-etch thickness) of the mask layer 308. The results of these measurements are generally provided to the controller of the processing system 102 and the host process controller 122.

At step 212b, the results of the measurements of step 211b may be used to adjust the process recipe of the polysilicon etch back of step 210b as described above in step 212a in reference to the results of the measurements of step 211a.

At step 213b, the results of the measurements of step 211b may be used to adjust process recipes of the ex-situ processing equipment 112 performing post-etch processing (discussed in reference to step 214b below), as described above in step 213a in reference to the equipment performing processes of step 214a.

Figure 3E:
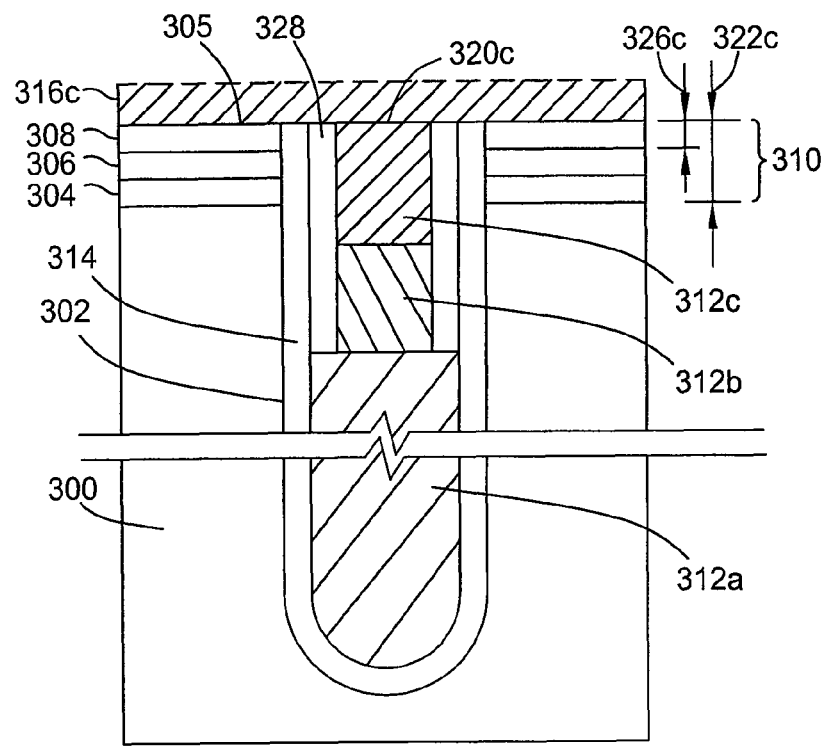

At step 214b, the post-etch ex-situ processes are performed upon the substrate 300 (FIG. 3E). In one exemplary embodiment, the ex-situ processing equipment (e.g., CVD, PVD, CMP, and the like equipment) fills the trench 302 with polysilicon (layer 312c), deposits a layer 316c of excess polysilicon, and removes the layer 316c using the CMP process, as discussed above in reference to the layers 316a-316b. Process recipes of the post-etch ex-situ processes (e.g., CMP process) may be adjusted using the results of the post-etch measurements performed at step 208b using the in-situ EYED™ module.

At step 216b, the sequence 200a-c transfers the substrate 300 to the processing system 102 and proceeds to step 202c to perform processes of a third pass of the multi-pass process of fabricating the capacitive structure of the trench capacitor.

At step 202c, the substrate 300 is provided to the ex-situ measuring tool 108 of the processing system 102. In one embodiment, the substrate 300 is transferred to the processing system 102 that was used during the first pass or second pass of the multi-pass process, however, in an alternate embodiment, the substrate 300 may be transferred to a different processing system.

At step 204c, the ex-situ measuring tool 104 obtains the measurements of a thickness 322c of the film stack 310 and thickness 326c of the mask layer 308 as described above in step 204a in reference to the measurements of the thickness 322a and thickness 326a, respectively.

At step 206c, the results of the measurements performed during step 204c are used to adjust the CMP processing equipment used at step 214b and detect a failure of the CMP processing equipment, as described above in step 206a in reference to the measurements of step 204a.

At step 207c, the results of the measurements of step 204c may be used to adjust a process recipe of the subsequent etch process (discussed in reference to step 210c below), as described above in step 207a in reference to the results of the measurements of step 204a.

At step 208c, the substrate 300 is transferred to the DPS II module comprising the in-situ module 108. In one embodiment, the substrate 300 is transferred to the same DPS II module that performed the etch back process of step 210a or step 210b. In an alternate embodiment, the substrate 300 may be transferred to a different DPS II module. In one exemplary embodiment, the in-situ module 108 obtains in-situ pre-etch measurements of the thickness 326c of the mask layer 308. The results of the measurements are generally provided to the controllers of the in-situ etch reactor and processing system 102 and the host process controller 122.

At step 209b, the results of the in-situ pre-etch measurements of the thickness 326c of the mask layer 308 are used to adjust the process recipe of the polysilicon etch back process, validate measurements of step 204c, and adjust the ex-situ processing equipment 112, as described above in step 209a in reference to the results of the measurements of the thickness 326a.

Figure 3F:
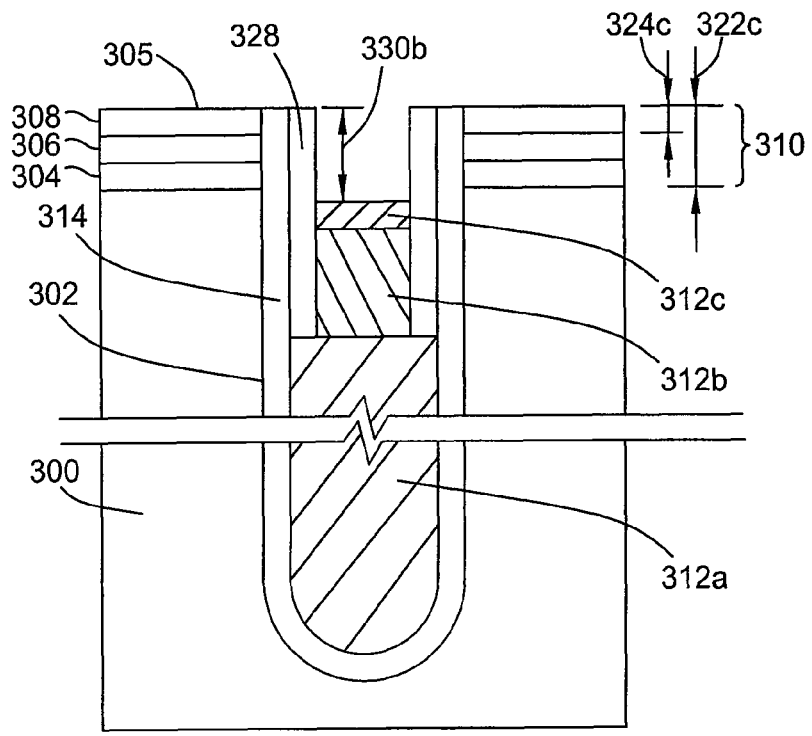

At step 210c, the DPS II module performs the polysilicon etch back process that etches the polysilicon layer 312c in the trench 302 to a pre-determined depth 330c (FIG. 3F). Step 210b uses the process recipe adjusted, at step 207c, using the results of the ex-situ measurements performed by the ex-situ measuring 104 tool and, at step 209c, using the results of the in-situ measurements performed by the in-situ module 108, respectively. Generally, steps 210a and 210c use the same or similar etchant gas mixtures.

At step 211b, the in-situ module 108 generally obtains in-situ post-etch measurements of the depth 330c and, optionally, a thickness 324c (i.e., post-etch thickness) of the mask layer 308. The results of these measurements are generally provided to the controller of the processing system 102 and the host process controller 122.

At step 212c, the results of the measurements of step 211c may be used to adjust the process recipe of the polysilicon etch back of step 210c as described above in step 212a in reference to the results of the measurements of step 211a.

At step 213c, the results of the measurements of step 211c may be used to adjust process recipes of the ex-situ processing equipment 112 performing post-etch processing (discussed in reference to step 214c below), as described above in step 213a in reference to the equipment performing processes of step 214a.

At step 214c, the post-etch ex-situ processes are performed upon the substrate 300. Process recipes of the post-etch ex-situ processes may be adjusted using the results of the post-etch measurements performed at step 208c using the in-situ module 108. At step 216c, the sequence 200a-c determines that the multi-step process of fabricating the capacitive structure of the trench capacitor is completed, and, at step 218, the sequence 200a-c ends.

Figure 4:
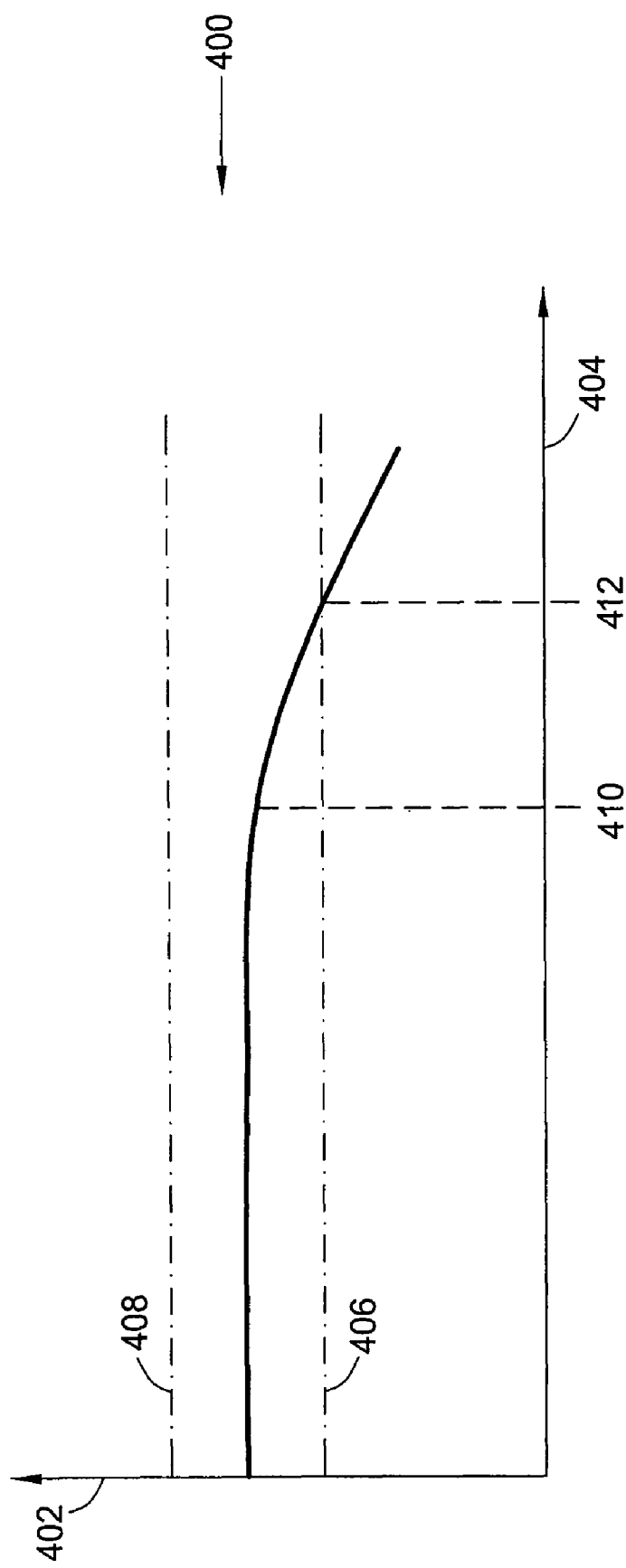
FIG. 4 depicts an exemplary diagram showing the results of ex-situ measurements for the capacitive structures of FIGS. 3A-3F.

FIG. 4 depicts an exemplary diagram illustrating the results of the ex-situ measurements of the structures (e.g., thickness 322a of the film stack 310) performed using the ex-situ measuring 104 tool during steps 204a. A graph 400 depicts the results (y-axis 402) of measuring the thickness 322a on the substrates of a batch of the substrates 300 versus a number of the substrates 300 (x-axis 404) processed using the ex-situ processing equipment 112 (e.g., CMP equipment). The results of the measurements are acceptable when the thickness 322a remains in a pre-determined range having a lower limit 406 and an upper limit 408, respectively.

In FIG. 4, the results of measuring the thickness 322 are illustratively shown as drifting over time beyond the lower limit 406, however, such results may similarly drift (not shown) in the opposite direction (i.e., beyond the upper limit 408). At a moment 410 when the drift is detected, operators of the respective substrate processing equipment are notified and the process recipe of such equipment may be adjusted to stop the drift. At a moment 412 when the drift exceeds the pre-determined limit 406 (or 408), a failure of the ex-situ processing equipment is detected.

Figure 5:
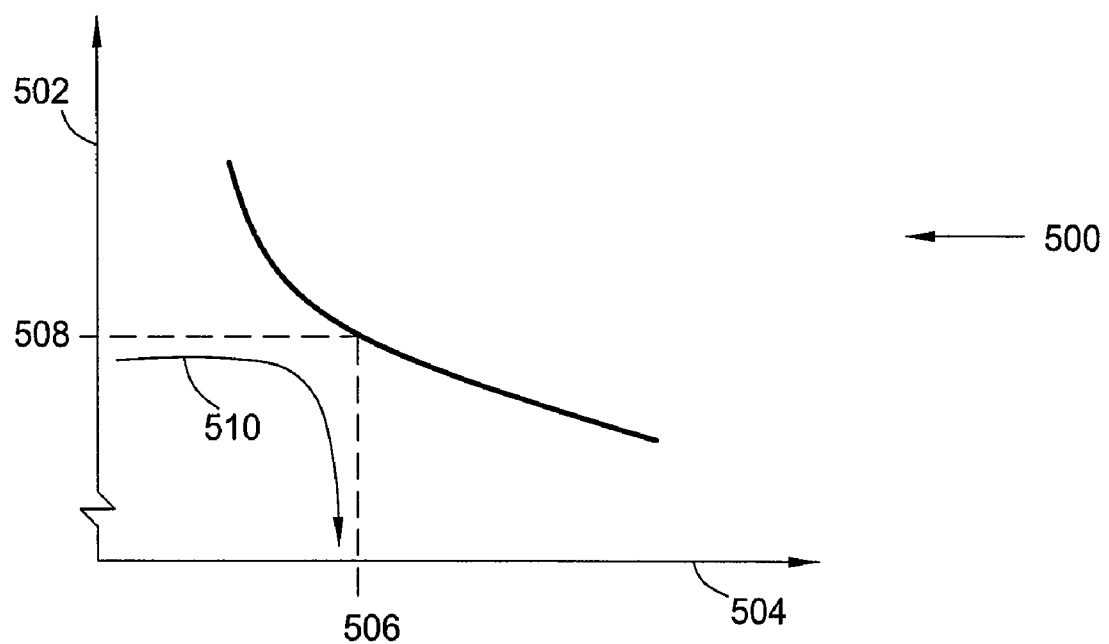
FIG. 5 depicts a graphical illustration of the relationship between an etch rate and critical dimensions of the capacitive structures of FIGS. 3A-3F.

FIG. 5 depicts a graphical illustration of a relationship between an etch rate and critical dimensions (e.g., width 303) of the trench 302 during the polysilicon etch back process of steps 208a-208c. Specifically, a graph 500 depicts the etch rate (y-axis 502) versus the width 303 (x-axis 504) of the trench 302. Using the graph 500, the etch rate 506 of the polysilicon etch back process corresponding to the trench 303 having a value 508 of the width 303 may be calculated as illustrated using arrow 510.

Figure 6:
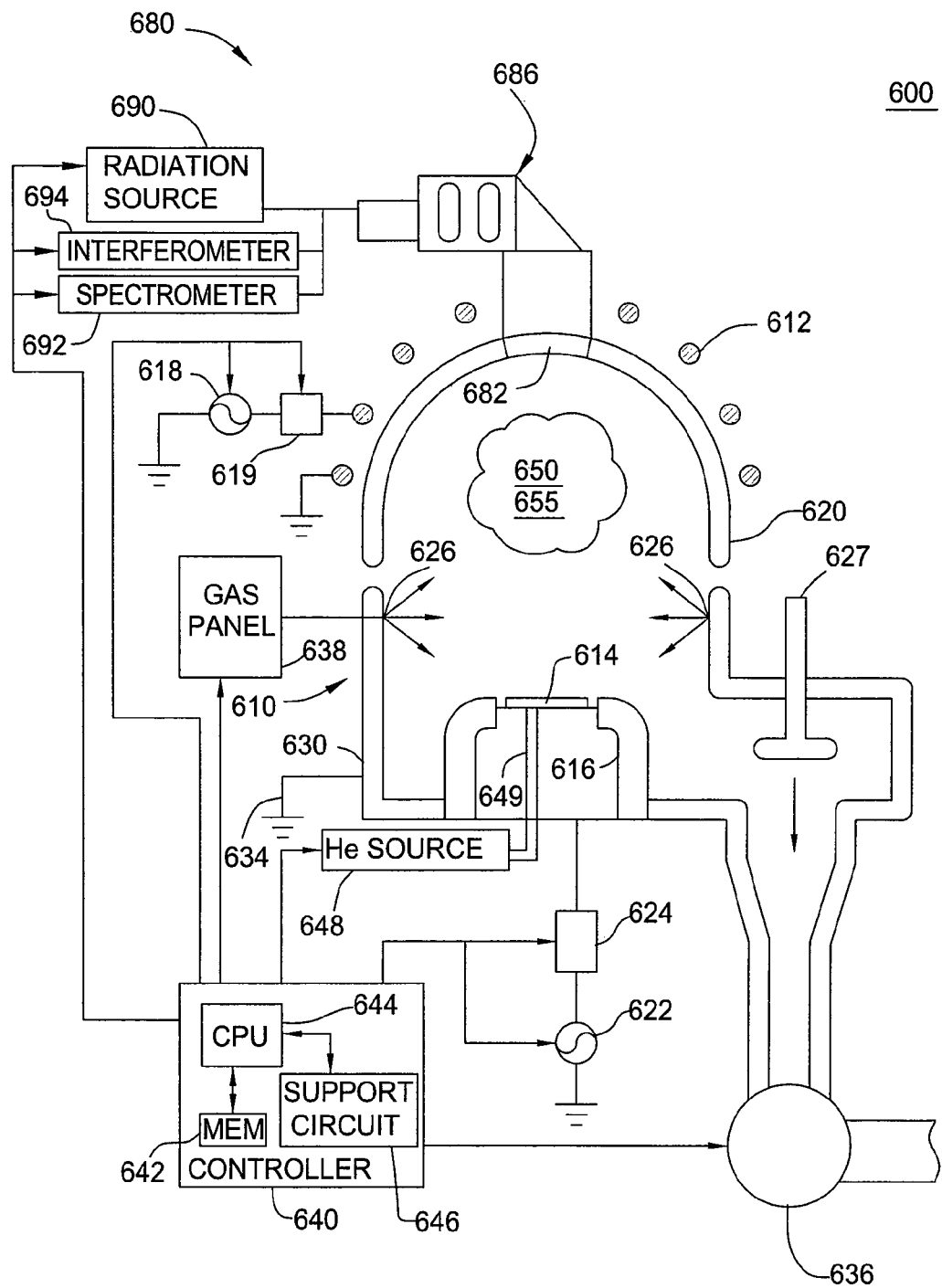
FIG. 6 depicts a schematic diagram of an exemplary plasma etch processing apparatus of the kind used in performing portions of the inventive method.

FIG. 6 depicts a schematic diagram of the Decoupled Plasma Source (DPS II) etch reactor 600 that illustratively may be used to practice portions of the invention. The DPS II reactor is generally used as a processing module of the processing system. In one embodiment, the reactor 600 comprises a process chamber 610 having a substrate support pedestal 616 within a conductive body (wall) 630, an in-situ measuring tool 680, and a controller 640.

The chamber 610 is supplied with a dielectric ceiling 620. In the depicted embodiment, the ceiling 620 has a substantially flat form factor. Other modifications of the chamber 610 may have other types of ceilings, e.g., a curved or domed ceiling. Above the ceiling 620 is disposed an antenna comprising at least one inductive coil element 612. The inductive coil element 612 is coupled, through a first matching network 619, to a plasma power source 618. The plasma source 618 typically is capable of producing up to 3000 W at a tunable frequency in a range from 50 kHz to 13.56 MHz.

The support pedestal (cathode) 616 is coupled, through a second matching network 624, to a biasing power source 622. The biasing source 622 generally is a source of up to 500 W at a frequency of approximately 13.56 MHz that is capable of producing either continuous or pulsed power. In other embodiments, the source 622 may be a DC or pulsed DC source.

The in-situ measuring tool 680 may be configured to perform interferometric and/or spectrometric measurements and generally comprises an optical assembly 686, a radiation source 690, a spectrometer 692, and an interferometer 694. The optical assembly 686 guides and focuses the incident radiation to illuminate a specific region of a substrate (e.g., semiconductor wafer) 614, as well as selectively collects a portion of the radiation reflected from the illuminated region and guides the radiation to the spectrometer 692 and interferometer 694.

The optical assembly 686 is disposed over a window 682 formed in the ceiling 620 and comprises passive optical components, such as lens, mirrors, beam splitters, and the like. The window 682 may be fabricated from quartz, sapphire, or other material that is transparent to the radiation produced by the radiation source 690. Optical interfaces between the assembly 686, radiation source 690, spectrometer 692, and interferometer 694 may be provided using fiber-optic cables.

The radiation source 690 is generally a source of radiation having a spectrum (wavelengths) in the range from about 200 to 800 nm. Such radiation source 690 may comprise, e.g., a mercury (Hg), xenon (Xe) or Hg—Xe lamp, tungsten-halogen lamp, light emitting diode (LED), and the like.

In one exemplary embodiment, the spectrometer 692 measures a spectral position of a minimum in the spectrum of the radiation that is reflected from the illuminated region of the wafer 614. The spectrometer 692 provides an electrical output signal related to a change in the spectral position of such a minimum with respect to a pre-selected (group or a single) reference wavelength in the instrument range.

In another exemplary embodiment, the interferometer 694 measures a change in the height of the structures disposed in the illuminated region on the wafer 614. The interferometer 694 provides an electrical output signal related to the change of the height with respect to a pre-selected reference height (e.g., about 1400 Angstroms) of the structures.

A controller 640 comprises a central processing unit (CPU) 644, a memory 642, and support circuits 646 for the CPU 644 and facilitates control of the components of the DPS II etch process chamber 610 and, as such, of the etch process, as discussed below in further detail.

In operation, the wafer 614 is placed on the pedestal 616 and process gases are supplied from a gas panel 638 through entry ports 626 and form a gaseous mixture 650. The gaseous mixture 650 is ignited into a plasma 655 in the chamber 610 by applying power from the plasma and bias sources 618 and 622 to the inductive coil element 612 and the cathode 616, respectively. Typically, the chamber wall 630 is coupled to an electrical ground 634. The pressure within the interior of the chamber 610 is controlled using a throttle valve 627 and a vacuum pump 636. The temperature of the wall 630 is controlled using liquid-containing conduits (not shown) that run through the wall 630.

The temperature of the wafer 614 is controlled by stabilizing a temperature of the support pedestal 616. In one embodiment, the helium gas from a gas source 648 is provided via a gas conduit 649 to channels (not shown) formed in the pedestal surface under the wafer 614. The helium gas is used to facilitate heat transfer between the pedestal 616 and the wafer 614. During the processing, the pedestal 616 may be heated to a steady state temperature using a resistive heater (not shown) within the pedestal, and then the helium gas facilitates uniform heating of the wafer 614. Using such thermal control, the wafer 614 may be maintained at a temperature of between about 20 and 350 degrees Celsius.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the process chamber 610 as described above, the controller 640 may be one of any form of general-purpose computer processor that can be used in an industrial setting for controlling various chambers and subprocessors. The memory, or computer-readable medium, 642 of the CPU 644 may be one or more of readily available memory such as random access memory (RAM), read only memory (ROM), floppy disk, hard disk, or any other form of digital storage, local or remote. The support circuits 646 are coupled to the CPU 644 for supporting the processor in a conventional manner. These circuits include cache, power supplies, clock circuits, input/output circuitry and subsystems, and the like. The inventive method is generally stored in the memory 642 as a software routine. The software routine may also be stored and/or executed by a second CPU (not shown) that is remotely located from the hardware being controlled by the CPU 644.

Figure 7:
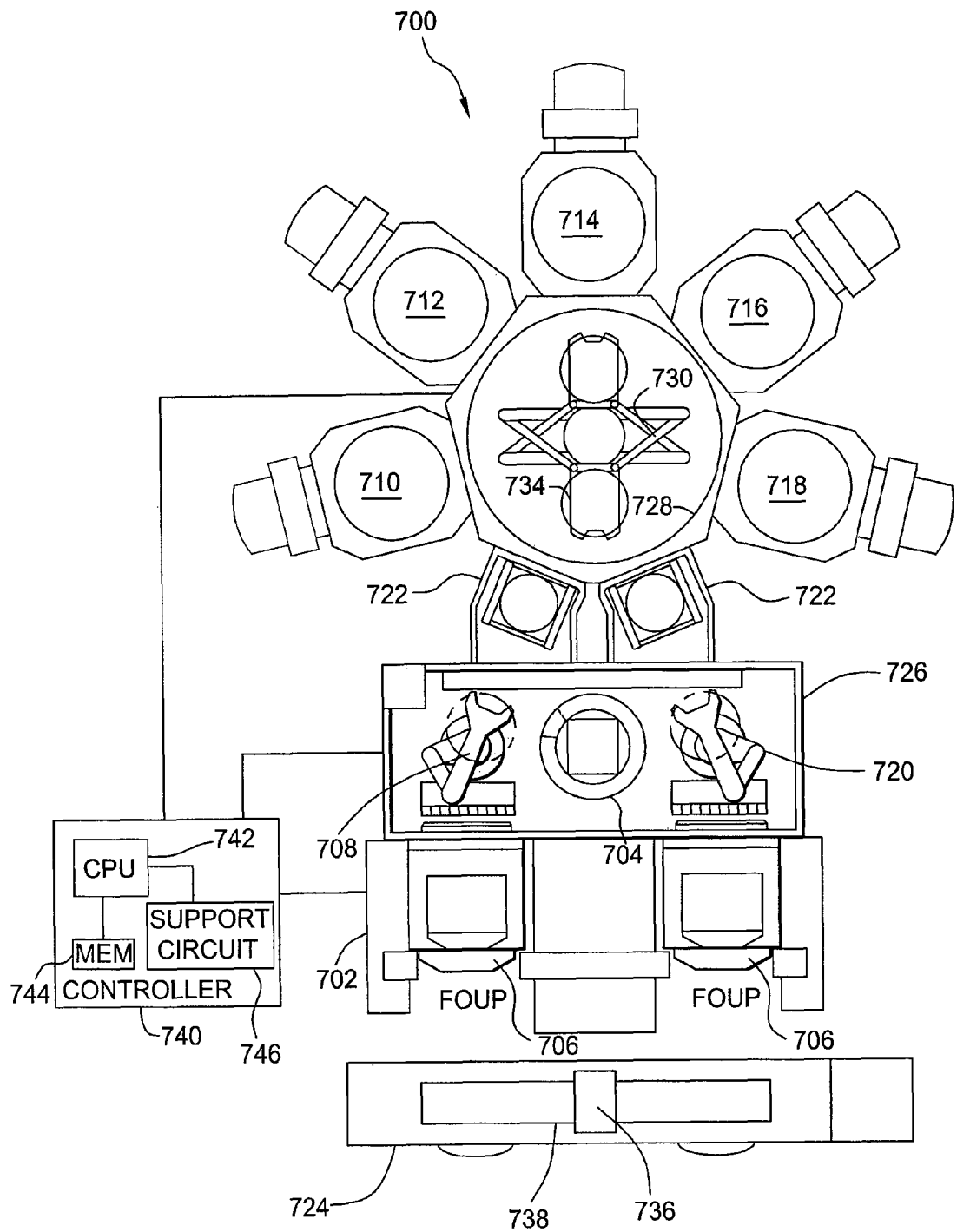
FIG. 7 depicts a schematic diagram of an exemplary integrated semiconductor substrate processing system of the kind used in performing portions of the inventive method.

FIG. 7 depicts a schematic diagram of an integrated semiconductor wafer processing system 700 that may illustratively be used to practice the invention. One system that may be utilized to practice the invention is the TRANSFORMA® integrated semiconductor processing system, available from Applied Materials, Inc. of Santa Clara, Calif. Herein the particular embodiment of the system 700 is provided for illustrative purposes and should not be used to limit the scope of the invention.

The system 700 generally includes load-lock chambers 722, process modules 710, 712, 714, 716, 718, a vacuumed plenum 728, a robot 730, an input/output module 702, a metrology module 726, and a system controller 740. The load-lock chambers 722 are used as docking stations for cassettes with the substrates and protect the plenum 728 from atmospheric contaminants. The robot 730 having a wafer receptacle 734 transfers the substrates between the load lock chambers and process modules. The input/output module 702 comprises at least one front opening unified pod (FOUP) 706 (two FOUPs are depicted) facilitating an exchange of the cassettes with the substrates between a factory interface 724 and the metrology module 726.

The metrology module 726 comprises an optical measuring tool 704 and two substrate robots 708 and 720 that transfer pre-processed and post-processed substrates between the FOUPs 706, optical measuring tool 704, and load-lock chambers 722. One measuring tool 704 suitable for obtaining optical measuring data is available from Nanometrics Incorporated, located in Milpitas, Calif.

The factory interface 724 is an atmospheric pressure interface used to transfer the cassettes with pre-processed and post-processed wafers between various processing systems and manufacturing regions of the semiconductor fab. Generally, the factory interface 724 comprises a substrate handling device 736 and a track 738. In operation, the substrate handling device 736 moves along the track 738.

The system controller 740 is coupled to and controls each module of the integrated processing system 700. The system controller 740 controls all aspects of operation of the system 700 using a direct control of modules and apparatus of the system 700 or, alternatively, by controlling the computers (or controllers) associated with these modules and apparatus. In operation, the system controller 740 enables feedback from the respective modules and apparatus to optimize substrate throughput.

The system controller 740 generally comprises a central processing unit (CPU) 742, a memory 744, and a support circuit 746. The CPU 742 may be of any form of a general purpose computer processor that can be used in an industrial setting. The support circuit 746 is conventionally coupled to the CPU 742 and may comprise cache, clock circuits, input/output subsystems, power supplies, and the like. The software routines, when executed by the CPU 742, transform the CPU into a specific purpose computer (controller) 740. The software routines may also be stored and/or executed by a second controller (not shown) that is located remotely from the system 700.

At least one of the process modules of the system 700 may be the DPS II plasma etch module used to perform portions of the present invention. The system 700 may also comprise other processing modules, such as the PRECLEAN II™ plasma cleaning module, the AXIOM® remote plasma module, the RADIANCE™ thermal processing module (all these process modules are available from Applied Materials, Inc.), and the like.

One example of a possible configuration of the system 700 for performing processes in accordance with the present invention includes two load-lock chambers 722, the DPS II modules 714, 716, and 718, the AXIOM® modules 710 and 712, the metrology module 726 comprising the measuring tool 704 and robots 708 and 720, and the input/output module 702 comprising two FOUPs 706.

Figure 8:
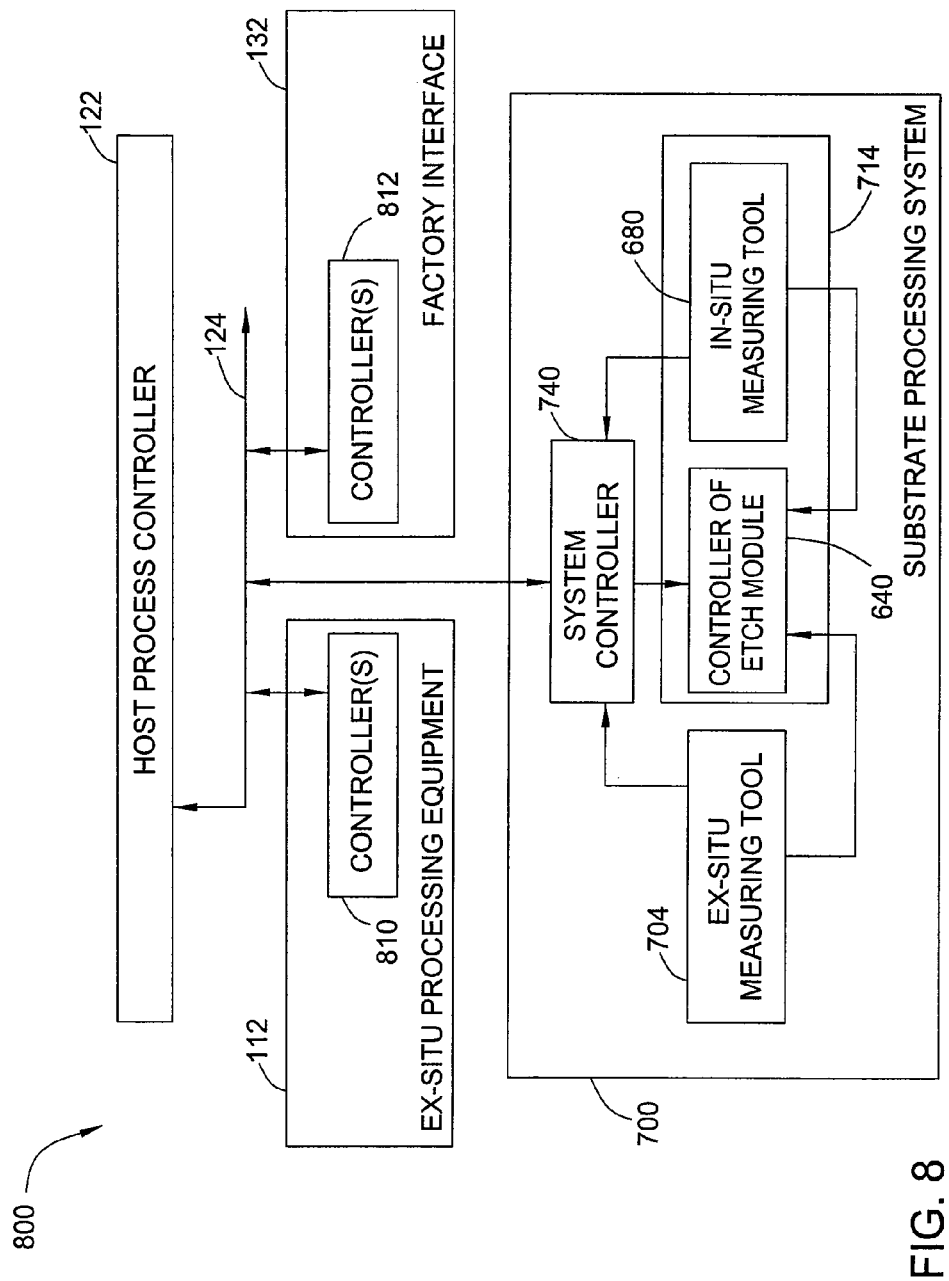
FIG. 8 depicts a schematic diagram for data exchange during the multi-pass process of FIG. 1 in accordance with one embodiment of the present invention.

FIG. 8 depicts a schematic diagram 800 of data exchange during a multi-pass process 100 in accordance with one embodiment (e.g., in reference to FIG. 1 and FIGS. 3A-3F) of the present invention. Data exchange is controlled by the host process controller 122. The host process controller 122 may use the bi-directional bus 124 to collect data from and distribute directives and data to the system controller 740 of the processing system 700, controller(s) 810 of the ex-situ processing equipment 112, and controller(s) 812 of the factory interface 132, as described above in reference to FIGS. 2A-2C. In the processing system 700, the results of measurements performed using the ex-situ measuring tool 704 and in-situ measuring tool 680 of the DPS II module (e.g., in the depicted embodiment, module 714) are generally communicated to the controller 640 of the DPS II module and the system controller 740. In an alternative embodiment, the ex-situ measuring tool 704 providing pre-etch measurements may be disposed remote from the processing system 102 in another location of the FAB and utilize the bus 124 to relay measurement data to the controller 122, from which the data is accessible the processing system 700.

Figure 9:
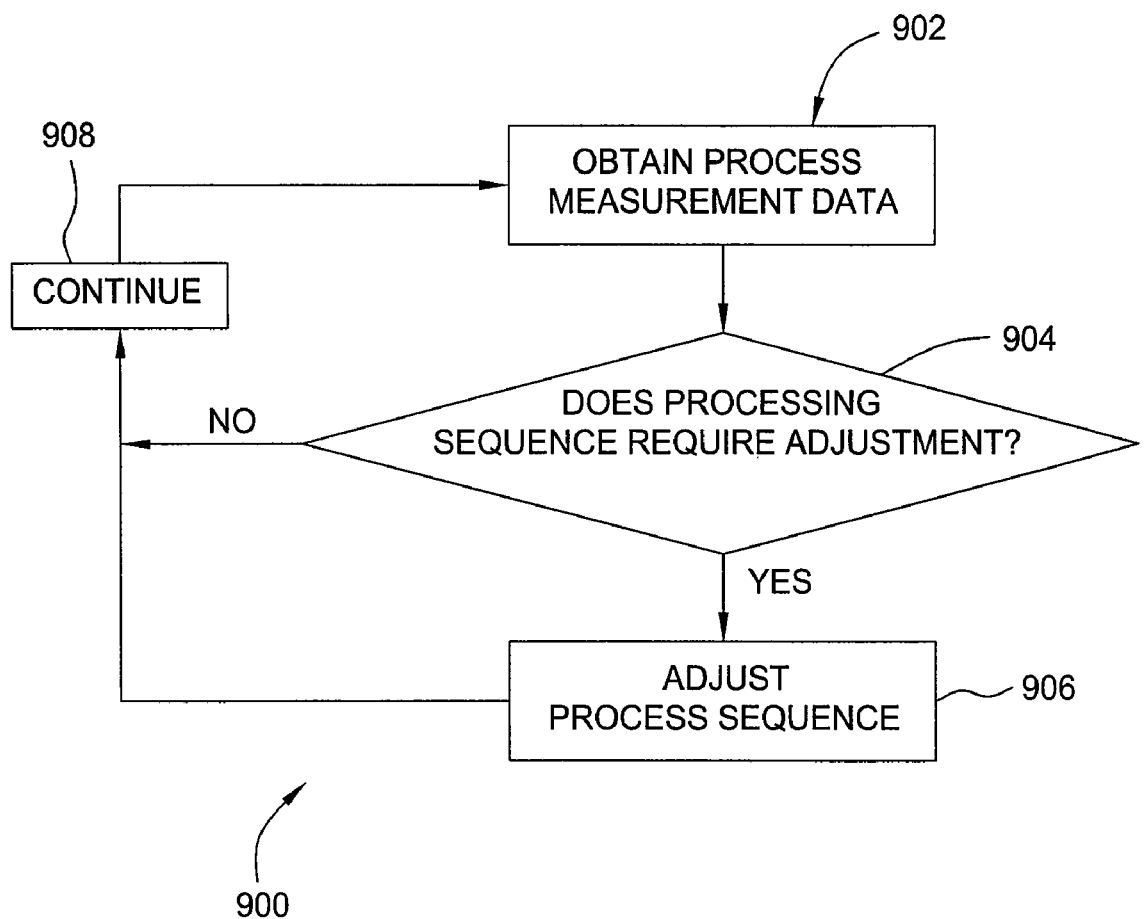
FIG. 9 depicts a schematic diagram for a method of adjusting a process sequence in a multi-pass IC fabrication cycle.

FIG. 9 depicts a schematic diagram for a method 900 of adjusting a process sequence in a multi-pass IC fabrication cycle utilizing in-situ and ex-situ data obtained as described above. The method begins at step 902 by obtaining process measurement data from a substrate. The process measurement data may be obtained using metrology tools remote from and/or within the etch reactor. For example, pre-process measurement data may be obtained from the host FAB controller, metrology equipment coupled to the substrate processing system which incorporates the process chamber in which the substrate is to be processed, or by an in situ measuring tool disposed within the process chamber.

At step 904, the process measurement data is received by at least one of the system controller or the post FAB controller and processed to determine if the processing sequence of the substrate being processed and/or other substrates being processed within the FAB requires adjustment. If adjustment is required, the method 900 proceeds to step 908 where a fabrication process is performed. After completion of step 908, the method 900 returns to step 902, where new process measurement data is obtained. The new process measurement data may be associated with the same or a different substrate.

If it is determined in step 904 that the processing sequence requires adjustment, the method 900 proceeds to step 906. The step 906 of adjusting the process sequence may include at least one of adjusting the metrology schedule and/or process steps of the substrate being processed, or of other substrates within the control of the post FAB. For example, the process sequence for a substrate associated with the process measurement data may be adjusted to include obtaining additional unscheduled metrology information. This may require the original process sequence of that substrate to be changed by routing the substrate to a metrology tool not included in the original process sequence.

In another embodiment, the process sequence of a substrate unassociated with the process measurement data may be changed to route that substrate to a metrology or process tool. It is contemplated that whenever the process sequence of one substrate within the FAB is adjusted from its original process sequence, the other wafers within the FAB may require their process sequences to be adjusted to accommodate the change and to maximize FAB throughput. The ability to adjust the process sequence of a substrate in response to measurement data in real time, and compensate for that adjustment by adjusting, if necessary, the process sequence for other substrates within the FAB, advantageously provides greater process flexibility while increasing device yield and maximizing throughput.

The invention may be practiced using other multi-pass processes wherein parameters may be adjusted to achieve acceptable characteristics by those skilled in the art by utilizing the teachings disclosed herein without departing from the spirit of the invention. Although the forgoing discussion referred to fabrication of a trench capacitor, fabrication of the other devices and structures used in the integrated circuits can also benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. A method of controlling a process of fabricating one or more structures on a substrate, comprising:
   (a) measuring, in-situ, at least one pre-etch dimension of at least one structure of a substrate disposed in an etch reactor;
   (b) etching the substrate with a process recipe selected or adjusted in response to the measurement in step (a);
   (c) measuring, in-situ, at least one post-etch dimension of at least one structure on the substrate in the etch reactor;
   (d) adjusting a process recipe of at least one post-etch process using at least one of the results of measuring the dimensions on the structures in steps (a) and (c); and
   (e) transferring the substrate from the etch chamber to another processing tool to perform the at least one post-etch process.

2. The method of claim 1, further comprising:
   (f) measuring at least one pre-etch dimension of at least one structure of the substrate in at least one ex-situ measuring tool external to the etch reactor prior to step (a).

3. The method of claim 2, wherein the measuring step (f) further comprises:
   measuring topographic dimensions and/or thickness of the at least one structure.

4. The method of claim 2, wherein the at least one ex-situ measuring tool and the etch reactor are modules of a processing system.

5. The method of claim 2, wherein at least one of the at least one ex-situ measuring tools is disposed external to a processing system having the etch reactor.

6. The method of claim 2, further comprising:
   adjusting the process recipe in step (b) utilizing the results of step (f).

7. The method of claim 2, further comprising:
   adjusting a process recipe of one or more pre-etch processes utilizing the results of step (f).

8. The method of claim 2, further comprising:
   detecting a failure of processing equipment performing at least one pre-etch process.

9. The method of claim 1, further comprising:
   adjusting a process recipe of one or more pre-etch processes utilizing the results of step (a).

10. The method of claim 1, further comprising:
    detecting a failure of processing equipment performing at least one pre-etch process or at least one post-etch process.

11. The method of claim 1, further comprising:
    etching a subsequent substrate in the etch reactor with a process recipe selected or adjusted in response to the measurement in step (c).

12. The method of claim 1, further comprising executing a multi-pass process by repeating steps (a)-(e) to form the at least one structure.

13. The method of claim 12, further comprising:
    performing at least one pre-etch process during at least one pass of the multi-pass process.

14. The method of claim 1, wherein the structures are selected from a group consisting of a blanket layer, a featured layer, a film stack having at least one blanket layer and a film stack having at least one featured layer.

15. The method of claim 1, wherein the measuring step uses a non-destructive measuring technique.

16. The method of claim 1, wherein the measuring steps (a) and (c) further comprise:
    measuring at least one of topography or thickness of the at least one structure.

17. The method of claim 1, wherein the at least one post-etch process is selected from a group consisting of a chemical mechanical polishing process, a deposition process, an etch process, an oxidation process, an annealing process and a lithographic process.

18. The method of claim 1, wherein step (b) further comprises:
    adjusting end point detection parameters of the etch recipe.

19. The method of claim 1, wherein the at least one structure is a capacitive structure of a trench capacitor comprising a polysilicon electrode layer.

* * * * *